United States Patent [19]

Fischer et al.

[11] Patent Number: 5,321,362
[45] Date of Patent: Jun. 14, 1994

[54] DIGITAL FILTERING OF EL CID DATA

[75] Inventors: Mark W. Fischer, Pittsburgh, Pa.; James W. Shelton, Raytown, Mo.

[73] Assignee: Westinghouse Electric Corp., Pittsburgh, Pa.

[21] Appl. No.: 945,143

[22] Filed: Sep. 15, 1992

[51] Int. Cl.$^5$ .............................................. G01R 31/14
[52] U.S. Cl. .................................... 324/510; 324/545; 324/551; 340/647
[58] Field of Search .............. 73/865.8; 324/220, 262, 324/510, 541, 545, 546, 551; 340/647

[56] References Cited

U.S. PATENT DOCUMENTS

| | | | |
|---|---|---|---|
| 4,301,399 | 11/1981 | Miller et al. | 324/541 |
| 4,803,563 | 2/1989 | Dailey et al. | 358/100 |
| 4,825,422 | 4/1989 | Takeda | 73/861.25 |
| 4,889,000 | 12/1989 | Jaafar et al. | 73/865.8 |
| 4,970,890 | 11/1990 | Jaafar et al. | 73/12 |
| 4,996,486 | 2/1991 | Posedel | 324/545 |
| 5,032,826 | 7/1991 | Miller et al. | 324/545 |
| 5,105,658 | 4/1992 | Jaafer et al. | 73/865.8 |

Primary Examiner—Kenneth A. Wieder
Assistant Examiner—Christopher Tobin

[57] ABSTRACT

An electrical generator inspection system comprises an electro-magnetic core imperfection detector that provides an analog signal representative of fault currents detected between adjacent laminations of a stator core; an analog-to-digital converter coupled to the detector for converting the analog signal to a digital signal; a digital filter coupled to the output of the converter for digitally filtering the digital signal to remove noise therefrom; and means for storing predetermined signal criteria and for comparing the filtered digital signal to the predetermined criteria to determine the location of the insulation defects along the stator core. In one embodiment, the system further comprises means for storing the filtered digital signal in a memory.

8 Claims, 2 Drawing Sheets

DIGITAL FILTERING OF EL CID DATA

FIELD OF THE INVENTION

The present invention relates generally to remote inspection of electrical generators using an Electromagnetic Core Imperfection Detector (EL CID), and particularly to filtering of EL CID data to facilitate fault detection.

BACKGROUND OF THE INVENTION

The stator cores of electrical generators and other electrical machines are made up of a "stack" of thousands of individual steel sheets or laminations. The thickness of an individual sheet is measured in thousandths of an inch. Each of the laminations is coated with a thin layer of electrical insulation to insulate it electrically from its neighbors. This insulation prevents the 60 HZ alternating magnetic flux in the stator core from inducing eddy currents between laminations. If the insulation between adjacent laminations becomes damaged during assembly, operation or maintenance, a conducting path may be formed through which currents are induced by the alternating flux. These conducting currents create "hot spots" which, if undetected, can result in catastrophic failure of the machine.

One type of apparatus suitable for detecting such stator core hot spots is an Electro-magnetic Core Imperfection Detector ("EL-CID"). An EL-CID detects potential hot spots electromagnetically by exciting the stator core and then measuring any resulting fault currents flowing through a damaged region. Typically, the EL-CID's sensors are held against the stator core laminations and transported the length of the stator core. As the sensors move along the length of the core, they produce an analog signal having a magnitude proportional to detected fault currents. By examining a plot of the magnitude of the analog signal versus the sensor distance along the length of the core, operators are able to detect which stator laminations have damaged insulation.

U.S. Pat. No. 4,970,890, assigned to Westinghouse Electric Corp. and incorporated herein by reference, discloses a stator core inspection system that employs such an EL-CID detector. In the past, the analog output signal from the EL-CID detector was fed directly to an X-Y plotter for visual inspection by the operator. From the plot, the operator was able to determine the location of any hot spots. In the '890 patent, however, the analog EL-CID signal is sampled by an analog-to-digital converter and the digital representation is stored in a computer. The operator is then able to use the panning and zooming capabilities of the computer to examine the EL-CID signal more closely.

One problem with all EL-CID inspection systems, and the system of the '890 patent in particular, is that the power plant surroundings and machinery introduce a significant amount of noise in the analog EL-CID signal. Noise in the EL-CID signal makes it more difficult for the operator to discover faults. Because analog-to-digital converters naturally perform some low-pass filtering at certain sampling rates, analog-to-digital conversion of the EL-CID signal eliminates some of the noise. However, this natural filtering is not enough to remove the bulk of the background noise from the EL-CID signal. Consequently, there is a need for a system and method for removing noise from an EL-CID signal while keeping the integrity of the EL-CID signal intact. The present invention satisfies this need.

SUMMARY OF THE INVENTION

The present invention is directed to an electrical generator inspection system and method for detecting insulation breakdown between two or more adjacent laminates of a generator stator. According to the invention, the system comprises an electro-magnetic core imperfection detector for providing an analog signal representative of fault currents detected due to defects in the insulation between laminates along the stator core. An analog-to-digital converter is coupled to the detector for converting the analog signal to a digital signal. A digital filter is coupled to the converter for digitally filtering the digital signal to remove background noise introduced by the power plant surroundings. According to a preferred embodiment, the digital filter comprises a third order low-pass digital elliptic filter.

In accordance with another aspect of the present invention, means are provided for storing predetermined signal criteria and for comparing the filtered digital signal to the predetermined criteria to determine the location of insulation defects along the stator core. The system may further comprise means for storing the filtered digital signal in a memory. Additionally, the filtered signal can be displayed on a computer monitor, X-Y plotter or laser printer. With the filtered signal, system operators are better able to determine where core imperfections have occurred.

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings, an embodiment that is preferred, it being understood, however, that the invention is not limited to the specific methods and instrumentalities disclosed. In the drawings.

DETAILED DESCRIPTION OF THE PREFERRED EMBODIMENT

Figure 1:
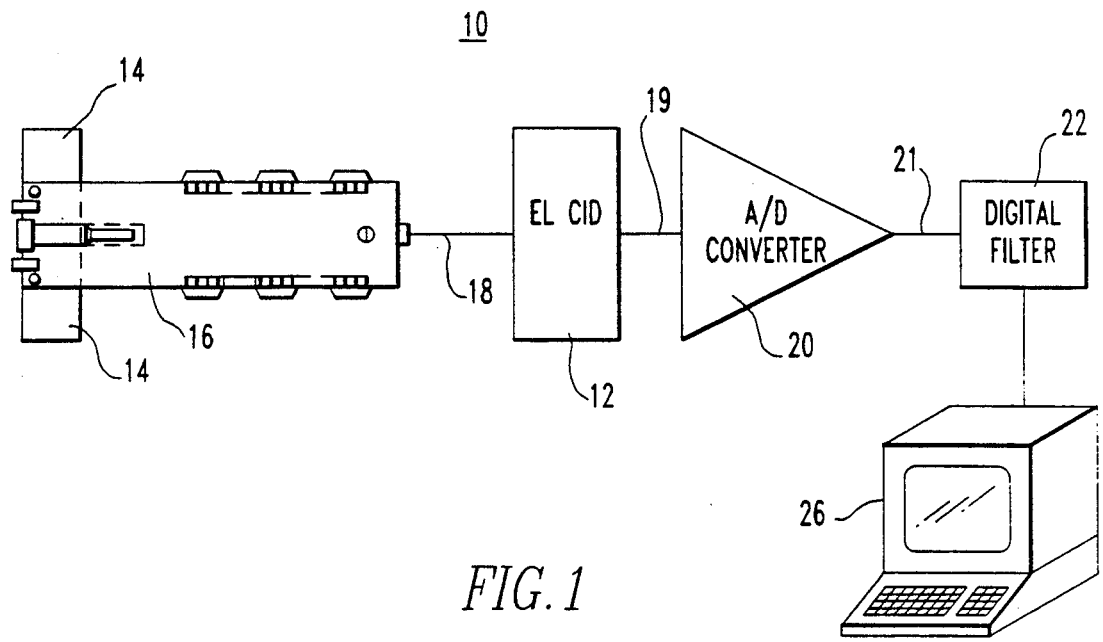
FIG. 1 is a block diagram of an electrical generator inspection system in accordance with the present invention.

Referring to the drawings in detail, wherein like numerals indicate like elements throughout, FIG. 1 shows an electrical generator inspection system 10 in accordance with the present invention. As shown, the system 10 comprises an electro-magnetic core imperfection detector ("EL CID") 12 having sensors 14 mounted on a carriage 16 and electrically connected to the EL CID 12 via line 18. In use, the carriage 16 is mounted to a stator core (not shown) such that it can be moved along the length of the stator. Further details of the carriage 16 and the manner in which it is mounted to the stator core can be found in U.S. Pat. No. 4,803,563, assigned to Westinghouse Electric Corp. and incorporated herein by reference. As the carriage 16 is maneuvered along the length of the stator (not shown), the sensors 14 pick up fault currents due to defects in the insulation between laminations. The EL CID 12 provides an analog signal representative of the magnitude of the fault currents versus the location or distance the carriage 16 has travelled.

Figure 2:
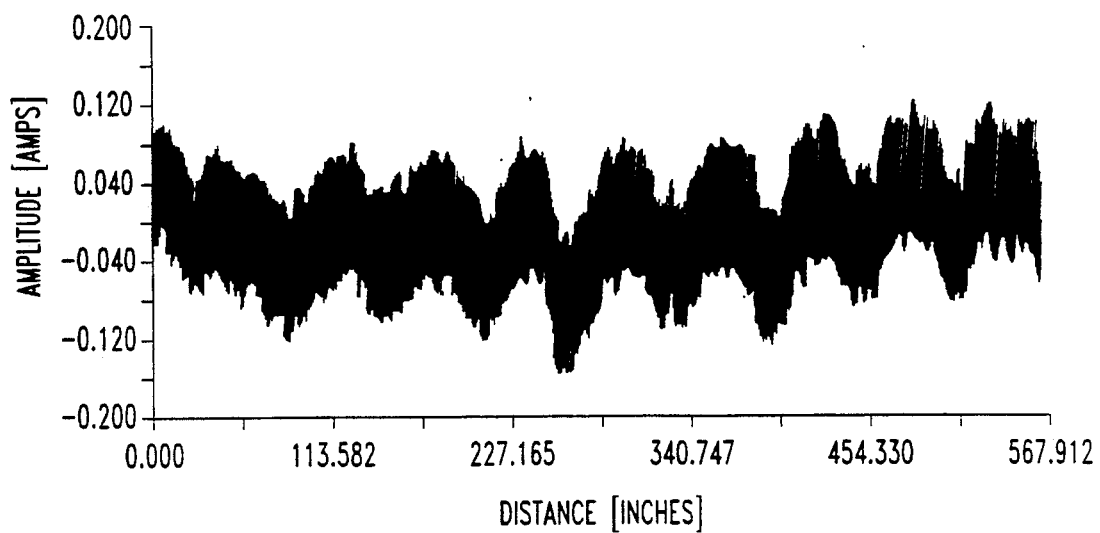
FIG. 2 is a plot of the output signal of an electro-magnetic core imperfection detector showing the effects of background noise on the signal.

The analog signal provided by the EL CID 12 is fed to an analog-to-digital converter 20 via line 19. The A/D converter 20 samples the analog signal and converts it to a digital signal. As mentioned in the Background of the Invention, due to the harsh environment of the power plant, a significant amount of background noise is introduced into the signal. Although the A/D converter 20 naturally filters some of this noise from the analog EL CID signal, the digital output from the A/D converter is still extremely noisy. FIG. 2 is a plot of a typical EL CID signal after analog-to-digital conversion by the A/D converter 20. As can be seen, despite any low-pass filtering effects from the A/D conversion, the signal of FIG. 2 is still extremely noisy making it difficult for an operator to determine where "hot spots" along the stator have occurred.

Figure 3:
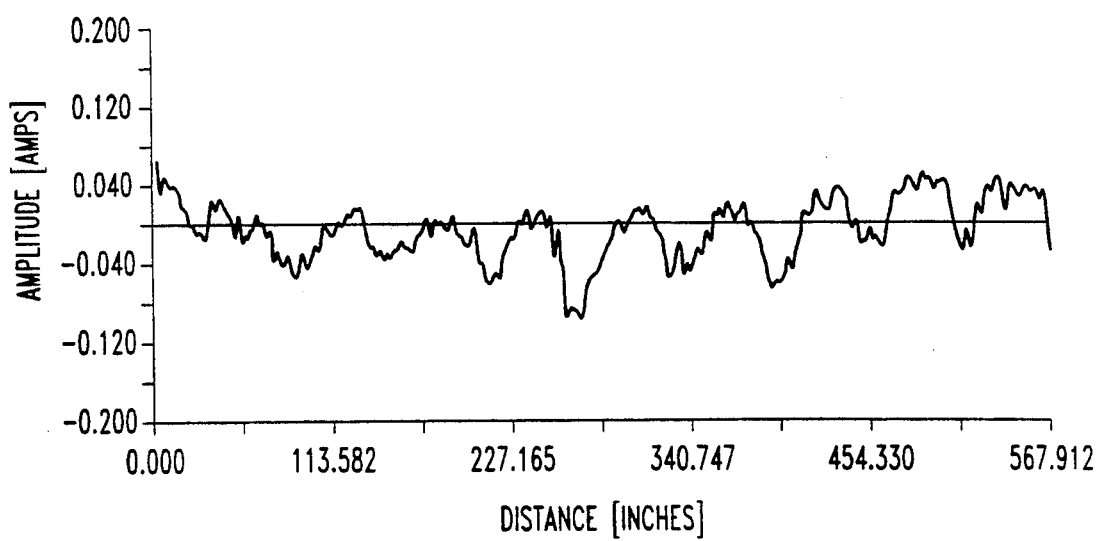
FIG. 3 is a plot of the signal of FIG. 2 after digitally filtering the signal in accordance with the present invention.

In accordance with the present invention, the digital signal from the A/D converter 20 is fed through a digital filter 22 via line 21. The digital filter 22 enhances the digital signal by removing noise without effecting the integrity of the signal. FIG. 3 shows a plot of the digital EL CID signal of FIG. 2 after passing through the digital filter 22. As can be seen, a significant amount of noise has been removed from the signal without effecting its integrity. With the filtered signal, an operator is much better able to determine where insulation damage has occurred along the stator. Typically, a defect in the lamination is indicated by a sustained rise in the amplitude of the EL CID signal at a given point along the stator core. Sharp rises or "spikes," however, do not indicate defects and are usually caused by spurious noise.

Because the average frequency of the background noise introduced into the EL CID signal is not substantially greater than the average frequency of the EL CID data, the digital filter must provide a sharp transition from passband to stopband, i.e., a narrow transition band. In a preferred embodiment, therefore, the digital filter 22 comprises a third order low-pass digital elliptic filter. The transfer function of the filter 22 in the Z-transform domain can be expressed as:

$$Y(z) = \frac{b(1) + b(2)z^{-1} + b(3)z^{-2} + b(4)z^{-3}}{a(1) + a(2)z^{-1} + a(3)z^{-2} + a(4)z^{-3}} X(z)$$

Where

X(z) is the un-filtered digital signal from the A/D converter 20; and

Y(z) is the filtered output.

In typical digital filtering applications, the signal being filtered represents amplitude versus time, however, EL CID data represents amplitude versus distance along the stator core. Thus, the filtering technique of the present invention was adapted for use with the distance-based EL CID signal. Preferably, the filter coefficients a(n) and b(n) have the following values:

$b(1) = 0.0263$  $a(1) = 1.0$ $b(2) = -0.0247$  $a(2) = -2.7906$ $b(3) = -0.0247$  $a(3) = 2.6193$ $b(4) = 0.0263$  $a(4) = -0.8255$

With these values, the digital filter 22 has a sufficiently sharp transition band to allow it to reject the background noise while maintaining the integrity of the EL CID data signal. In the preferred embodiment, the filter 22 is implemented in software, although a separate circuit or special purpose processor can be employed.

Figure 4:
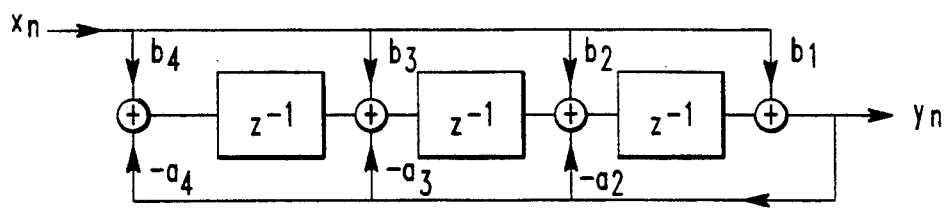
FIG. 4 illustrates the digital filter of FIG. 1 in canonical form.

FIG. 4 shows the digital filter of the present invention in canonical form and shows the logic by which the filter is implemented in software. $X_n$ represents the unfiltered digital values from the A/D converter, and $Y_n$ represents the filtered values. The blocks labeled $Z^{-1}$ represent unit delays. As can be seen, the input values $X_n$ are multiplied by the b() variables, and the output values $Y_n$ are fed back into the algorithm and multiplied by the a() variables. Accordingly, the output progression of the filter is:

$$Y_1 = X_1 {}^* b_1$$
$$Y_2 = X_2 {}^* b_1 + X_1 {}^* b_2 - Y_1 {}^* a_2$$
$$Y_3 = X_3 {}^* b_1 + X_2 {}^* b_2 + X_1 {}^* b_3 - Y_2 {}^* a_2 - Y_1 {}^* a_3$$
$$\vdots \qquad \vdots$$

where $X_1$ represents the first value sampled by the A/D converter 20, $Y_1$ represents the first digitally filtered output value, and so on. The progression continues for each sample in the digital signal.

As shown in FIG. 1, the filtered digital EL CID signal passes from the digital filter 22 to a computer 26. As mentioned above, a defect in the lamination is indicated by a sustained rise in the amplitude of the EL CID signal at a given point along the stator core. Sharp rises or "spikes" generally do not indicate defects and are usually caused by spurious noise. According to another feature of the present invention, the computer 26 provides means for storing predetermined signal criteria and for comparing the filtered EL CID signal to the predetermined criteria to determine the location of any insulation defects along the stator core. For example, to discern between spikes in the EL CID signal and sustained rises, the predetermined criteria may specify a threshold amplitude value and a minimum distance. If the amplitude of the EL CID signal rises above the threshold, and remains above the threshold while the sensors 14 move through the specified minimum distance, then the computer can indicate a core imperfection at that location. The predetermined criteria may be adjusted for different sizes or types of stators. Thus, the present invention provides a flexible detection system that relieves the operator of the burden of visually inspecting the EL CID signal. Alternatively, however, the filtered signal may immediately be displayed on the computer's monitor 26, or plotted on an X-Y plotter (not shown) or laser printer (not shown) for visual inspection by the operator.

The computer 26 also provides means for storing the filtered EL CID signal in a memory. By storing the signal in a memory, the operator can take advantage of the panning and zooming features of the computer 26. Although the computer 26 preferably provides both the means for storing predetermined signal criteria and comparing the filtered EL CID signal to the criteria and the means for storing the filtered signal in a memory, those skilled in the art will appreciate that either means may be provided by separate hard-wired circuitry without deviating from the spirit and scope of the present invention. Additionally, those skilled in the art will appreciate that the digital filter 22 of FIG. 1 may be implemented by the computer 26 and is shown separately for purposes of description only.

As the foregoing detailed description illustrates, the present invention comprises an electrical generator inspection system employing a digital filter to remove background noise from an EL CID signal. It will be appreciated by those skilled in the art that changes could be made to the embodiment described above without departing from the broad inventive concepts thereof. It is understood, therefore, that this invention is not limited to the particular embodiment disclosed, but is intended to cover all modifications which are within the scope and spirit of the invention as defined by the appended claims.

What is claimed is:

1. An electrical generator inspection system for detecting insulation breakdown between two or more adjacent laminates of a generator stator, and operable to provide enhanced digital signals while maintaining signal integrity, comprising:
an electro-magnetic core imperfection detector for providing an analog signal representative of fault currents detected due to defects in the insulation between laminates along the stator core, said analog signal comprising the amplitude of the fault current versus the distance traversed along the length of the stator core;
an analog-to-digital convertor coupled to said detector for converting the analog signal to a digital signal; and
a low-pass digital elliptic filter of at least the third order coupled to said converter to substantially remove noise from said digital signal while simultaneously maintaining signal integrity.

2. The system of claim 1 further comprising means for storing predetermined signal criteria and for comparing said filtered digital signal to said predetermined criteria to determine automatically the location of said insulation defects along the stator core.

3. The system of claim 1 further comprising means for storing said filtered digital signal in a memory.

4. In an electrical generator inspection system employing an electro-magnetic core imperfection detector which provides an analog signal representative of fault currents detected due to defects in the insulation between laminates along the stator core, a method comprising the steps of:
converting the analog signal provided by said detector to a digital signal;
digitally filtering said digital signal using at least a third order low-pass digital elliptic filter to substantially remove noise from said digital signal without destroying the integrity of the digital signal;
storing predetermined signal criteria in a computer means; and
comparing said filtered digital signal to said predetermined signal criteria to automatically determine the location of said insulation defects along the stator core.

5. Method according to claim 4 further comprising the step of storing the filtered digital signal in a memory.

6. An inspection system to detect insulation breakdown in the stator core of an electrical generator and operable to provide enhanced signals while maintaining signal integrity, said system comprising,
a plurality of sensors mounted on a carriage adapted for movement along said stator core, said carriage being electrically connected to an electro-magnetic core imperfection detector to thereby provide an analog signal representative of fault currents due to defects in the lamination of said stator core; said analog signal comprising a magnitude of the fault current versus the distance traversed along the stator core;
an analog-to-digital convertor coupled to said electro-magnetic core imperfection detector for converting said analog signal into a digital signal; and
a digital filter coupled to said analog-to-digital converter to remove noise from said digital signal, without destroying the integrity of the digital signal, said digital filter being in the form of the following expression:

$$Y(z) = \frac{b(1) + b(2)z - 1 + b(3)z - 2 + b(4)z - 3}{a(1) + a(2)z - 1 + a(3)z - 2 + a(4)z - 4} X(z)$$

wherein $X(z)$ comprises the un-filtered digital signal from the analog-to-digital convertor, $a(n)$ and $b(n)$ are filter coefficients, and $Y(z)$ is the resultant filtered output.

7. An electrical generator system according to claim 6, further comprising a computer means for storing predetermined signal criteria and for comparing the filtered digital signal to said signal criteria to determine the location of any insulation defects along the length of the stator core.

8. An electrical generator system as recited in claim 6, wherein the $a(n)$ and $b(n)$ filter coefficients have the following values:
$a(1) = 1.0$
$a(2) = -2.7906$
$a(3) = 2.6193$
$a(4) = -0.8255$
$b(1) = 0.0263$
$b(2) = -0.0247$
$b(3) = -0.0247$
$b(4) = 0.0263$

* * * * *